(12) United States Patent
Hayakawa et al.

(10) Patent No.: US 6,421,264 B1
(45) Date of Patent: *Jul. 16, 2002

(54) CAM CELL CIRCUIT HAVING DECISION CIRCUIT

(75) Inventors: Shigeyuki Hayakawa, Kanagawa-ken; Masashi Hirano, Tokyo, both of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/506,498

(22) Filed: Feb. 18, 2000

(30) Foreign Application Priority Data

Feb. 22, 1999 (JP) .............................. 11-043834

(51) Int. Cl.⁷ ............................................... G11C 15/00
(52) U.S. Cl. ........................ 365/49; 365/154; 365/203; 711/108
(58) Field of Search ........................ 365/49, 154, 203; 711/108

(56) References Cited

U.S. PATENT DOCUMENTS

| | | | | |
|---|---|---|---|---|
| 4,694,425 A | | 9/1987 | Imel ............................ | 365/49 |
| 5,617,348 A | * | 4/1997 | Maguire ...................... | 365/49 |
| 5,621,677 A | * | 4/1997 | Jones .......................... | 365/49 |
| 5,754,463 A | * | 5/1998 | Henstrom et al. ............ | 365/49 |
| 6,011,709 A | * | 1/2000 | Tanaka et al. ................ | 365/49 |
| 6,278,298 B1 | | 8/2001 | Hayakawa ................... | 326/119 |

FOREIGN PATENT DOCUMENTS

JP          9-45870          2/1997

OTHER PUBLICATIONS

David Bearden et al., "Digest of Technical Papers" IEEE International Solid–State Circuits Conference, ISSCC95, TP 10.3, pp. 174–175, (Feb. 1995).

* cited by examiner

*Primary Examiner*—David Nelms
*Assistant Examiner*—Connie C. Yoha
(74) *Attorney, Agent, or Firm*—Finnegan, Henderson, Farabow, Garrett & Dunner, L.L.P.

(57) ABSTRACT

A CAM Cell circuit having a memory cell circuit to store data, a decision circuit to decide whether comparison data match stored data on said memory cell circuit or not, and an output circuit to output a decision result made by said decision circuit to a match line is disclosed. The CAM Cell circuit has an exclusive-OR circuit connecting in parallel a circuit having first and second transistors in series-connection. It also has a circuit having third and fourth transistors in series-connection. The CAM Cell circuit also has a pre-charging circuit having a circuit connecting in series fifth and sixth transistors with different polarity from that of the first to fourth transistors, wherein stored data on the memory cell circuit, and stored data with different polarity from that of the former data are applied to each gate of the second and fourth transistors, respectively, the fifth and sixth transistors simultaneously become on to pre-charge the exclusive-OR circuit to output a not-match signal to said match line by controlling the output circuit before the decision operation. Subsequently, comparison data and comparison data with different polarity from that of the former data are supplied to each gate of the first and third transistors, respectively, and the exclusive-OR circuit decides whether the stored data on the memory cell circuit match the comparison data to output a match or not-match signal to said match line by controlling said output circuit based on a decision result.

20 Claims, 9 Drawing Sheets

CAM CELL CIRCUIT HAVING DECISION CIRCUIT

BACKGROUND OF THE INVENTION

1. Field of the Invention

The present invention relates to a CAM (Content Addressable Memory) Cell Circuit which detects whether comparison data match pre-stored data or not.

2. Description of the Related Art

The most similar one to the present invention in conventional CAM Cell Circuit technologies is described by Motorola/IBM as Technical Paper 10.3 of 1955 IEEE International Solid-State Circuits Conference, and has a circuit structure shown in FIG. 1.

The conventional CAM Cell Circuit comprises a latch circuit 1 having six transistors, inverters 2, 6 having two transistors, transfer gates 3, 4 having one or two transistors, and a pull-down transistor 5. Those circuits are connected to a read/write word line R/W WL, a bit line BL, a bit line BL', and comparison data lines CompD, CompD'.

When the read/write word line R/W WL becomes active, and then, "0", and "1", for example, are Input to the latch circuit 1 from the bit line BL, and the bit line BL', respectively, the latch circuit 1 preserves "0", the control terminal side of the transfer gate 3 becomes "0", and that side of the transfer gate 4 "1".

Thereafter, when "0", and "1" are input to the latch circuit 1 from the comparison data lines CompD, CompD', respectively, "1" of the comparison data line CompD' is inverted to "0" by the inverter 6. At this time, as "1" is applied to the control terminal side of the transfer gate 4, and the gate 4 becomes conductive, "0" is applied to the gate of the pull-down transistor 5.

Therefore, the pull-down transistor 5 becomes off, and a match line Match "1" to detect that the same data as comparison data has been stored on the latch circuit 1.

In conventional CAM Cell Circuits such as the above circuit, the latch circuit 1 comprises six transistors, the inverter 2 two transistors, and the transfer gates 3, 4 one or two transistors. And one pull-down transistor is further installed. That is, the conventional CAM Cell Circuits comprise 13 or 15 transistors in total.

Therefore, there have been a problem that the conventional CAM Cell Circuits are large in the circuit area due to large number of circuit elements, and the large circuit area slows down the operation of the circuit to prevent it from keeplng-up with speeding up of processors in recent years.

SUMMARY OF THE INVENTION

The present invention is made to solve the above-mentioned drawbacks of conventional CAM Cell Circuits. The object of the present invention is to offer a CAM Cell Circuit capable of speeding up of the operation by reducing the number of circuit elements and the circuit area.

In order to achieve the above-mentioned object, a first characteristic of the present invention is as follows:

A CAM Cell Circuit has a memory cell circuit to store data, a decision circuit to decide whether comparison data match stored data on said memory cell circuit or not, and an output circuit to output a decision result made by said decision circuit to a match line, said decision circuit comprising an exclusive-OR circuit connecting in parallel a circuit having first and second transistors in series-connection, and a circuit having third and fourth transistors in series-connection: and a pre-charging circuit having a circuit connecting in series fifth and sixth transistors with different polarity from that of said first to fourth transistors, wherein stored data on said memory cell circuit, and stored data with different polarity from that of the former data are applied to each gate of said second and fourth transistors, respectively, said fifth and sixth transistors simultaneously become on to pre-charge said exclusive-OR circuit to output not-match signal to said match line by controlling said output circuit before the decision operation, and thereafter, comparison data and comparison data with different polarity from that of the former data are applied to each gate of said first and third transistors, respectively, and said exclusive-OR circuit decides whether the stored data on said memory cell circuit match the comparison data to output a match or not-match signal to said match line by controlling said output circuit based on a decision result.

A second characteristic of the present invention is as follows:

A CAM Cell Circuit has a memory cell circuit to store data, a decision circuit to decide whether comparison data match stored data on said memory cell circuit or not, and an output circuit to output a decision result made by said decision circuit to a match line, said decision circuit comprising an exclusive-OR circuit connecting in parallel a circuit having first and second transistors in series-connection, and a circuit having third and fourth transistors in series-connection; and a pre-charging circuit connecting in parallel a circuit having fifth and sixth transistors with different polarity from that of said first to fourth transistors, and a circuit having seventh and eighth transistors with different polarity from that of said first to fourth transistors, wherein stored data on said memory cell circuit, and stored data with different polarity from that of the former data are applied to each gate of said fifth and seventh transistors, respectively, stored data on said memory cell circuit and stored data with different polarity from that of the former data are applied to each gate of said second and fourth transistors, respectively, either said circuit having the fifth and sixth transistors in series-connection or said circuit having the seventh and eighth transistors in series-connection becomes on to pre-charge said exclusive-OR circuit to output not-match signal to said match line by controlling said output circuit before decision operation, and thereafter, comparison data and comparison data with different polarity from that of the former data are applied to each gate of said first and third transistors, respectively, said exclusive-OR circuit decides whether the stored data on said memory cell circuit match the comparison data to output a match or not-match signal to said match line by controlling said output circuit based on a decision result.

A third characteristic of the present invention is as follows:

A CAM Cell Circuit has a memory cell circuit to store data, a decision circuit to decide whether comparison data match stored data on said memory cell circuit or not, and an output circuit to output a decision result made by said decision circuit to a match line, said decision circuit comprising an exclusive-OR circuit having first and second transistors connected together at each drain; and a pre-charging circuit connecting in series fourth and fifth transistors with different polarity from that of said first and second transistors, wherein stored data on said memory call circuit, and stored data with different polarity from that of the former data are applied to each source of said first and second transistors, respectively, said fourth and fifth transistors simultaneously become on to pre-charge said exclusive-OR circuit to output not-match signal to said match line by controlling said output circuit before decision operation, and thereafter, comparison data and comparison data with different polarity from that of the former data are applied to each gate of said first and second transistors, respectively, and said exclusive-OR circuit decides whether the comparison data match the stored data on said memory cell circuit to output a match or not-match signal to said match line by controlling said output circuit based on a decision result.

A fourth characteristic of the present invention is as follows:

A CAM Cell Circuit has a memory cell circuit to store data, a decision circuit to decide whether comparison data match stored data on said memory cell circuit or not, and an output circuit to output a decision result made by said decision circuit to a match line, said decision circuit comprising an exclusive-OR circuit having first and second transistors connected together at each drain; and a pre-charging circuit connecting in parallel a circuit having third and fourth transistors with different polarity from that of said first and second transistors, and a circuit having fifth and sixth transistors with different polarity from that of said first and second transistors, wherein stored data on said memory cell circuit, and stored data with different polarity from that of the former data are applied to each gate of said third and fifth transistors, respectively, stored data on said memory cell circuit, and stored data with different polarity from that of the former data are applied to each source of said first and second transistors, either said circuit having said third and fourth transistors in series-connection, or said circuit having said fifth and sixth transistors in series-connection becomes on to pre-charge said exclusive-OR circuit to output not-match signal to said match line by controlling said output circuit before decision operation, and thereafter, the comparison data and the comparison data with different polarity from that of the former data are applied to each gate of said first and second transistors, respectively, and said exclusive-OR circuit decides whether the comparison data match the stored data on said memory cell circuit to output a match or not-match signal to said match line by controlling said output circuit based on a decision result.

A fifth characteristic of the present invention is as follows:

A CAM Cell Circuit has a memory cell circuit to store data, a decision circuit to decide whether comparison data match stored data on said memory cell circuit or not, and an output circuit to output a decision result made by said decision circuit to a match line, said decision circuit comprising a static-type exclusive-OR circuit configured to connect in parallel a circuit having a first transistor and a second transistor with different polarity from that of the first one in series-connection, and a circuit having a third transistor and a fourth transistor with different polarity from that of the third one in series-connection, and to have said second and third transistors connected together at each drain, further to connect the drain of said first transistor, and the source of said second transistor, and to connect the drain of said third transistor, and the source of said fourth transistor, wherein stored data on said memory cell circuit, and stored data with different polarity from that of the former data are applied to each gate of said first and second transistors, respectively, become on to make said exclusive-OR circuit pre-charge state to output not-match signal to said match line by controlling said output circuit before decision operation and thereafter, comparison data, and comparison data with different polarity from that of the former data are applied to each source of said second and third transistors, and said exclusive-OR circuit decides whether the comparison data match the stored data on said memory cell circuit or not to output a match or not-match signal to said match line by controlling said output circuit based on a decision result.

In a preferred embodiment of the invention, it is desirable that a pair of bit lines to input data to said memory cell circuit may be also used as a pair of comparison data lines to input comparison data to said exclusive-OR circuit.

In a further preferred embodiment, it is desirable that said memory cell circuit may be a latch circuit, and said output circuit may comprise a pull-down transistor to pull-down said match line to a reference potential which means not-match state.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Figure 1:
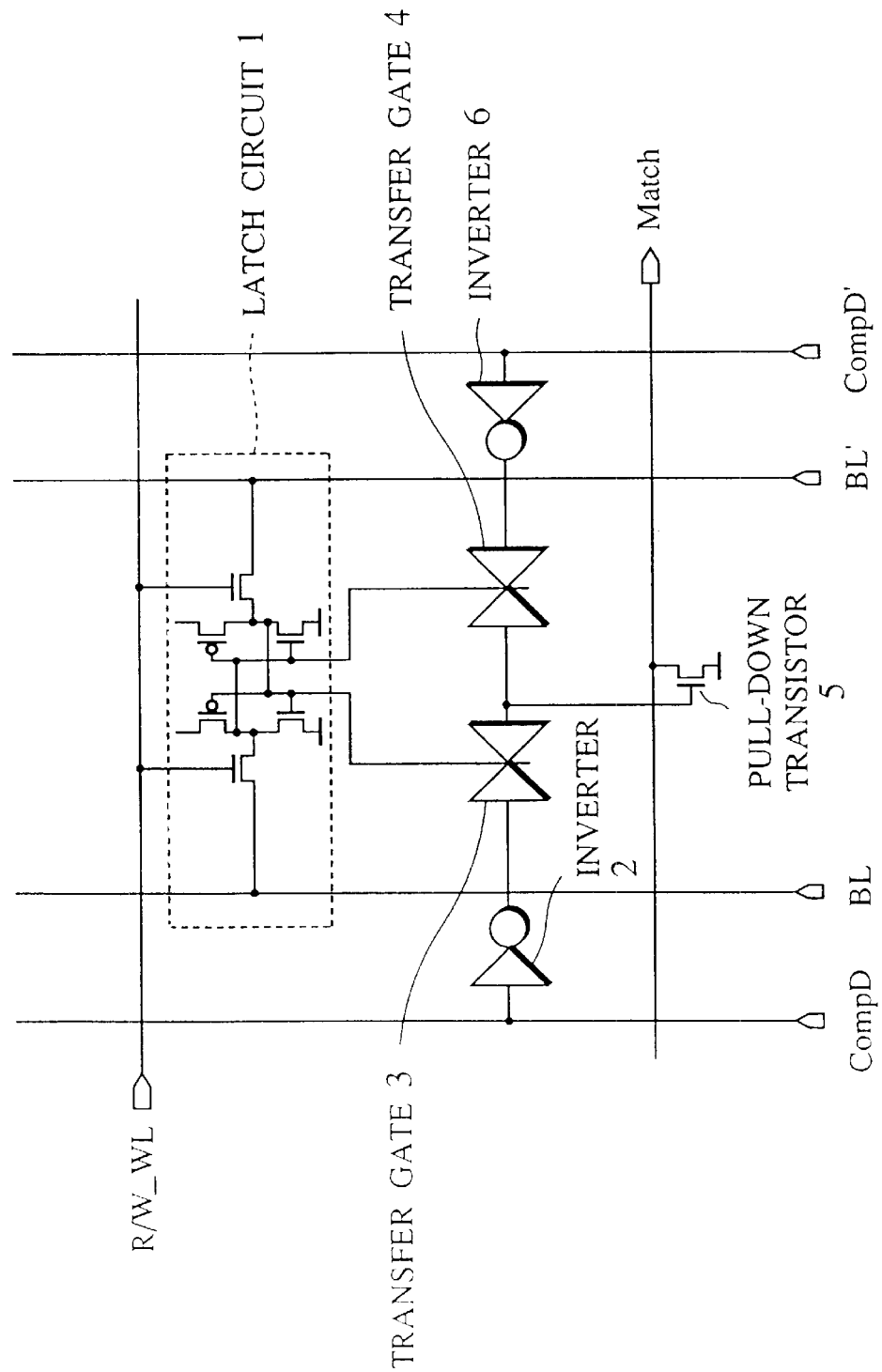
FIG. 1 is a circuit diagram of a configuration example of one of conventional CAM circuits.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following description, numerous specific details are set fourth such as specific signal values, etc. to provide a through understanding of the present invention. However it will be obvious to those skilled in the art that the present invention may be practiced without such specific details.

First Embodiment

Figure 2:
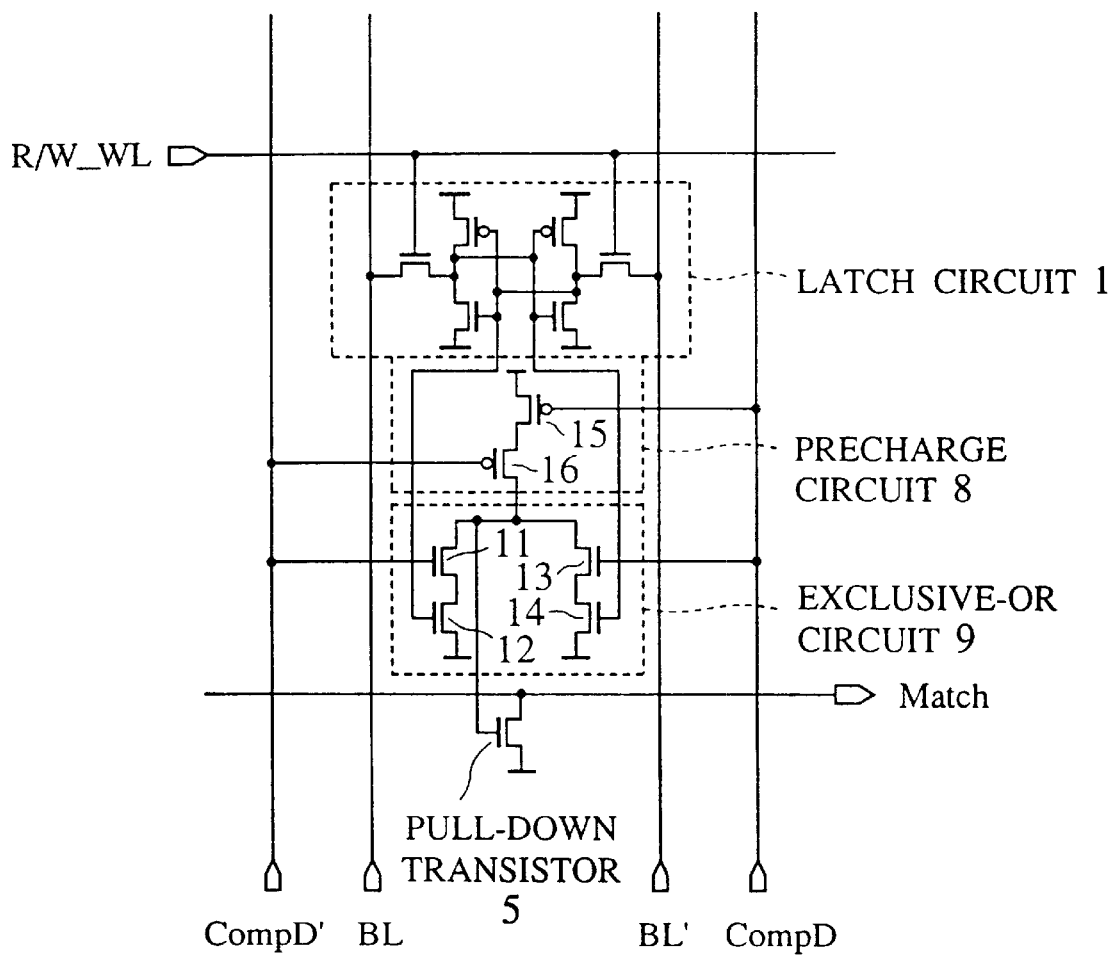
FIG. 2 is a circuit diagram of a first embodiment of a CAM Cell Circuit of the present invention.

FIG. 2 is a circuit diagram of a first embodiment of a CAM Cell Circuit of the present invention. The CAM cell Circuit comprises a latch circuit 1, a pre-charging circuit 8, an exclusive-OR circuit 9, and a pull-down transistor 5. Those circuits are connected to a read/write word line R/W WL, a bit line BL, a bit line BL', comparison data lines CompD, CompD', and a match line.

The latch circuit 1 comprises six NMOS transistors (hereafter, called simply as MOS transistor) similarly as the example of the conventional CAM Cell Circuit shown in FIG. 1. The pre-charging circuit 8 comprises a circuit connecting in series two PMOS transistors 15, 16. The exclusive-OR circuit 9 connects in parallel a circuit having NOS transistors 11, 12 in series-connection, and a circuit having MOS transistors 13, 14 in series-connection.

Then the operation of this embodiment will be described: Firstly, the latch circuit 1 is assumed to preserve, for example, "0". During a pre-charging period under "0", "0" states of the comparison data lines CompD, CompD', and under an on state of the PMOS transistors 15, 16 of the pre-charging circuit 8, "1" is applied to the drains of the MOS transistors 11, 13 of the exclusive-OR circuit 9 to pre-charge the circuit 9.

During an evaluation period, "0" is input to the comparison data line CompD, and "1" to the line CompD'. Hereby, "1" is applied to the gate of the MOS transistor 11, and "0" to the gate of the MOS transistor 13.

At this time, "1" has been applied to the gate of the MOS transistor 12, and "0" to the gate of the MOS transistor 14, as the latch circuit 1 preserves "0".

Accordingly, the MOS transistors 11, 12 become on, and the MOS transistors 13, 14 off to apply "0" to the gate of the pull-down transistor 5. Then, the pull-down transistor 5 becomes off, and the match line Match "1" to detect that the same data as comparison data are stored on the latch circuit 1.

Secondly, the latch circuit 1 is assumed to preserve, for example, "1". During the pre-charging period, the exclusive-OR circuit 9 is pre-charged similarly as the above-mentioned case. During the evaluation period, "0" is input to the comparison data line CompD, and "1" to the line CompD'. Hereby, "1" is applied to the gate of the MOS transistor 11, and "0" to the gate of MOS transistor 13.

At this time, "0" has been applied to the gate of the MOS transistor 12, and "1" to the gate of the MOS transistor 14, as the latch circuit 1 preserves "1".

Accordingly, the MOS transistors 11, 14 become on, and the MOS transistors 12, 13 off to apply "1" to the gate of the pull-down transistor 5. Then, the pull-down transistor 5 a becomes on, and the match line Match "0" to detect that different data from the comparison data are stored on the latch circuit 1 (a not-match state).

However, during the evaluation period, the transistor 16 becomes off to cause a floating state of the drains of the MOS transistors 11, 13.

According to this embodiment, though the number of used transistors is the same as that of the conventional circuits, there is no need to have a contact with other transistors as the MOS transistors 11, 12 of the exclusive-OR circuit 9 are connected in series, and the MOS transistors 13, 14 of the circuit 9 are also done so. Therefore, it is possible to reduce the circuit area and speed up the operation.

Second Embodiment

Figure 3:
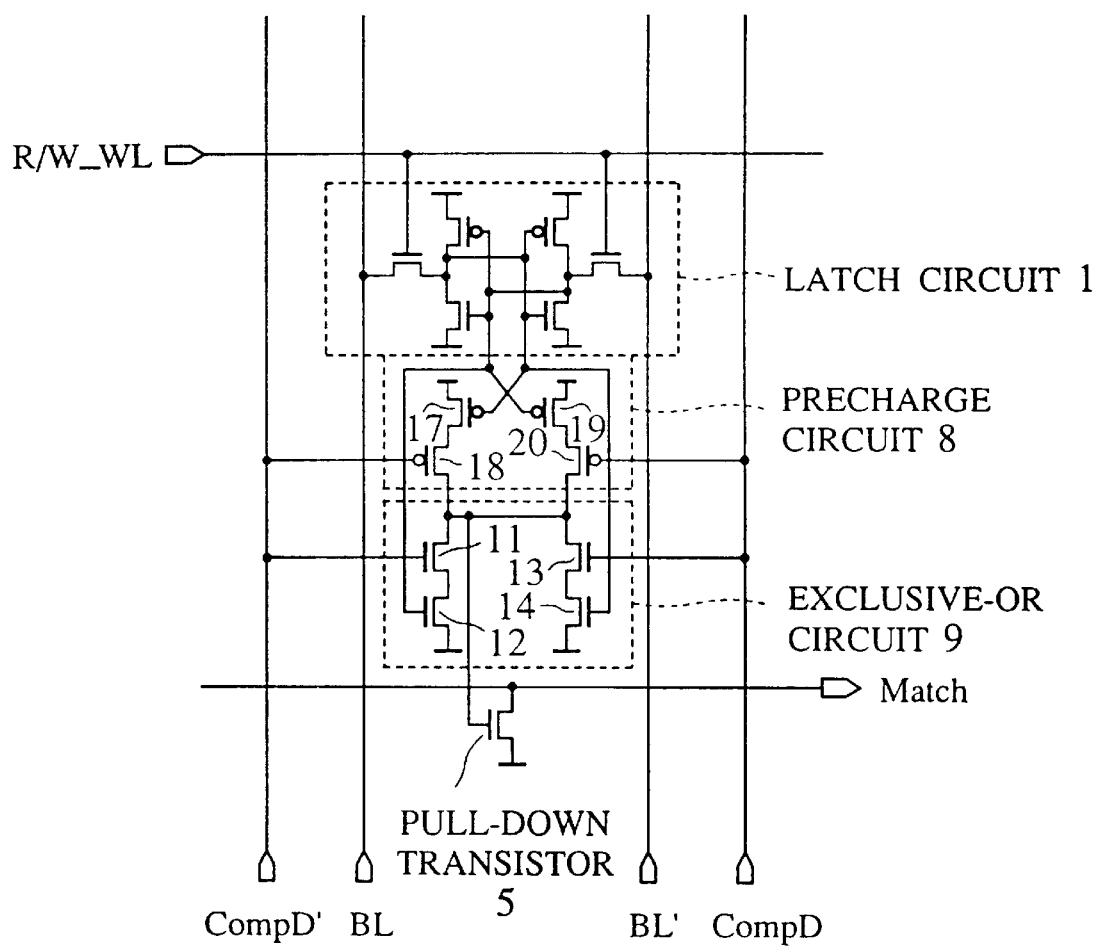
FIG. 3 is a circuit diagram of a second embodiment of a CAM Cell Circuit of the present invention.

FIG. 3 is a circuit diagram of a second embodiment of a CAM Cell Circuit of the present invention. The CAM Cell Circuit comprises a latch circuit 1, a pre-charging circuit 8, an exclusive-OR circuit 9, and a pull-down transistor 5. Those circuits are connected to a read/write word line R/W WL, a bit line BL, a bit line BL', comparison data lines CompD, CompD', and a match line.

It is different from the first embodiment shown in FIG. 2 that the pre-charging circuit 8 of this embodiment connects in parallel a circuit having PMOS transistors 17, 18 in series-connection, and a circuit having PMOS transistors 19, 20 in series connection, and the pre-charging voltage to the exclnsive-OR circuit 9 is preserved even after the pre-charging period. Other configuration is the same as the first embodiment.

Then the operation of the embodiment will be described: Firstly, the latch circuit is assumed to preserve "0". Hereby, "0" is applied to the gate of the PMOS transistor 17, and the transistor becomes on. During a pre-charging period under "0", "0" states of the comparison data lines CompD, CompD', the PMOS transistors 17, 18 of the pre-charging circuit 8 become on, and "1" is applied to the MOS transistors 11, 13 of the exclusive-OR circuit 9 to pre-charge the circuit 9.

During an evaluation period, "0" is input to the comparison data line CompD, "1" to the line CompD'. Hereby, "1" is applied to the gate of the MOS transistor 11, and "0" to the gate of the MOS transistor 13.

At this time, "1" has been applied to the gate of the MOS transistor 12, and "0" to the gate of the MOS transistor 14, as the latch circuit 1 preserves "0".

Accordingly, the MOS transistors 11, 12 become on, and the drains of the MOS transistors 11, 13 "0" to apply "0" to the gate of the pull-down transistor 5. Then, the pull-down transistor 5 becomes off, and the match line Match "1" to detect that the same data as comparison data are stored on the latch circuit 1.

During the evaluation period, "1" is applied to the PMOS transistors 18, 19, and "0" to the PMOs transistors 17, 20. Then, the PMOS transistors 18 becomes off, and the PMOS transistor 19 off. Hereby, "1" is not applied to the exclusive-OR circuit 9 from the pre-charging circuit 8, and the drains of the MOS transistor 11, 13 of the exclusive-OR circuit 9 preserves "0" not to cause the floating state of the exclusive-OR circuit 9.

Secondly, the latch circuit 1 is assumed to preserve, for example, "1". During the pre-charging period, "0" is input to the comparison data lines CompD, CompD', and the transistors 19, 20 become On to pre-charge the exclusive-OR circuit 9.

During the evaluation period, "0" is input to the comparison data line CompD, and "1" to the line CompD'. Hereby, "1" is applied to the gate of the MOS transistor 11, and "0" to the gate of the MOS transistor 13.

At this time, "0" has been applied to the gate of the MOS transistor 12, and "1" to the gate of the MOS transistor 14, as the latch circuit 1 preserves "1".

Accordingly, the MOS transistors 11, 14 become on, and the MOS transistors 12, 13 off to apply "1" to the gate of the pull-down transistor 5. Then, the pull-down transistor 5 becomes on, and the match line Match "0" to detect that different data from the comparison data are stored on the latch circuit 1 (a not-match state).

However, during the evaluation period under an on state of the PMOS transistors 19, 20, the drains of the MOS transistor 11, 13 remain "1" not to cause the floating state.

According to this embodiment, even during said evaluation period under the "0" state of the comparison data line CompD, the pre-charging circuit 8 becomes on not to cause the floating state, and the exclusive-OR circuit 9 remains pre-charged not to discharge the charge. Therefore, it is possible to stabilize the evaluation operation.

Third Embodiment

Figure 4:
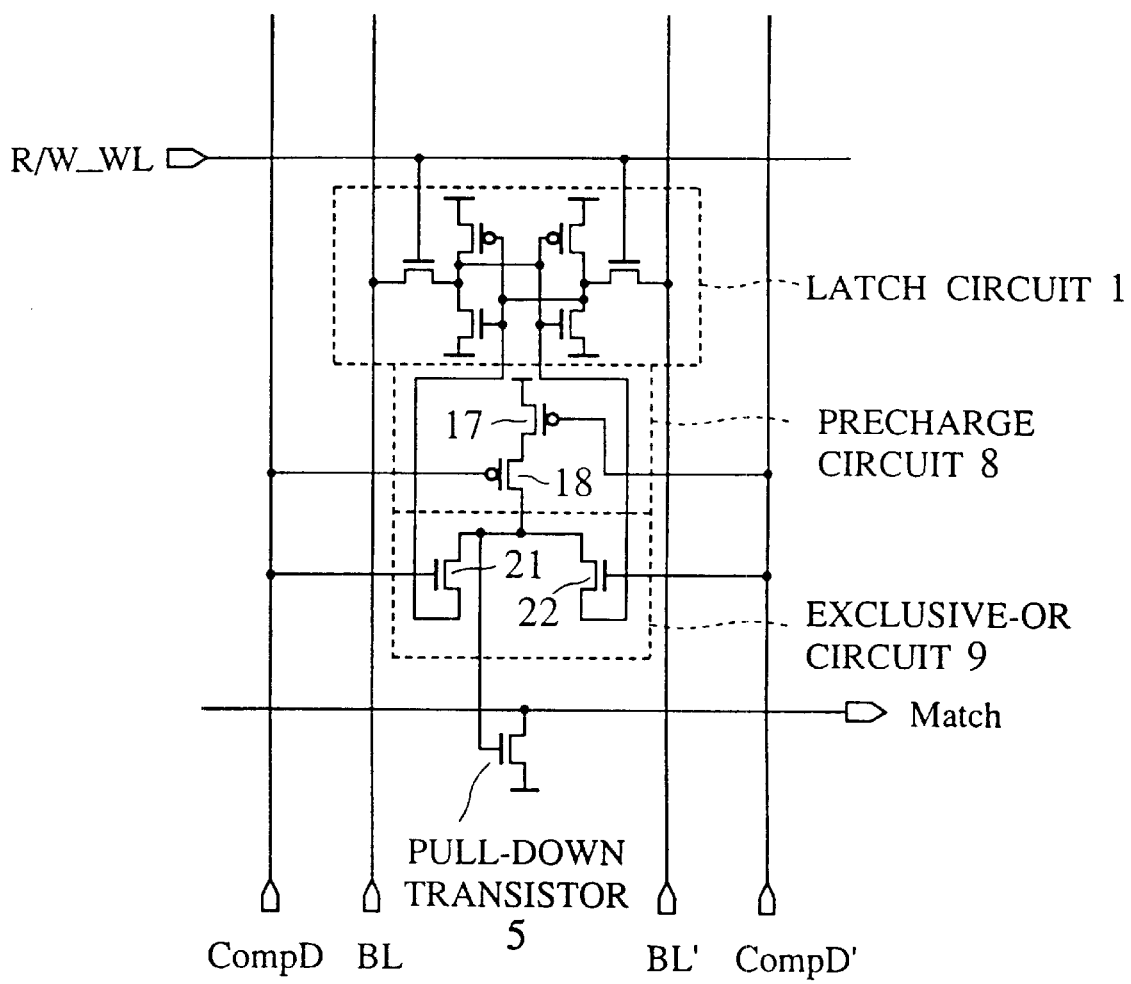
FIG. 4 is a circuit diagram of a third embodiment of a CAM Cell Circuit of the present invention.

FIG. 4 is a circuit diagram of a third embodiment of a CAM Cell Circuit of the present invention. The CAM Cell Circuit comprises a latch circuit 1, a pre-charging circuit 8, an exclusive-OR circuit 9, and a pull-down transistor 5. Those circuits are connected to a read/write word line R/W WL, a bit line BL, a bit line BL', comparison data lines CompD, CompD', and a match line.

It is different from the first embodiment shown in FIG. 2 that the exclusive-OR circuit 9 of this embodiment comprises a circuit having MOS transistors 21, 22 in parallel connection. Other configuration is the same as the first embodiment.

Then the operation of this embodiment will be described:

Firstly, the latch circuit 1 is assumed to preserve "0". During a pre-charging period under "0", "0" states of the comparison data lines CompD, CompD', the PMOS transistors 17, 18 of the pre-charging circuit 8 become on, and "1" is applied to the MOS transistors 21, 22 of the exclusive-OR circuit 9 to pre-charge the circuit 9.

During an evaluation period, "0" is input to the comparison data line CompD, "1" to the CompD'. Hereby, "0" is applied to the gate of the MOS transistor 21, and "1" to the gate of the MOS transistor 22.

Hereby, the MOS transistor 21 becomes off, and the MOS transistor 22 on. "0" is input to the source of the MOS transistor 22, and the drains of the MOS transistors 21, 22 become "0" to apply "0" to the gate of the pull-down transistors 5. Then, the pull-down transistor 5 becomes off, and the match line Match "1" to detect that the same data as comparison data is stored on the latch circuit 1.

According to this embodiment, as the exclusive-OR circuit 9 comprises two transistors, it is possible to install smaller number of the circuit elements than that of conventional circuits, reduce the circuit area, and speed up the operation.

Forth Embodiment

Figure 5:
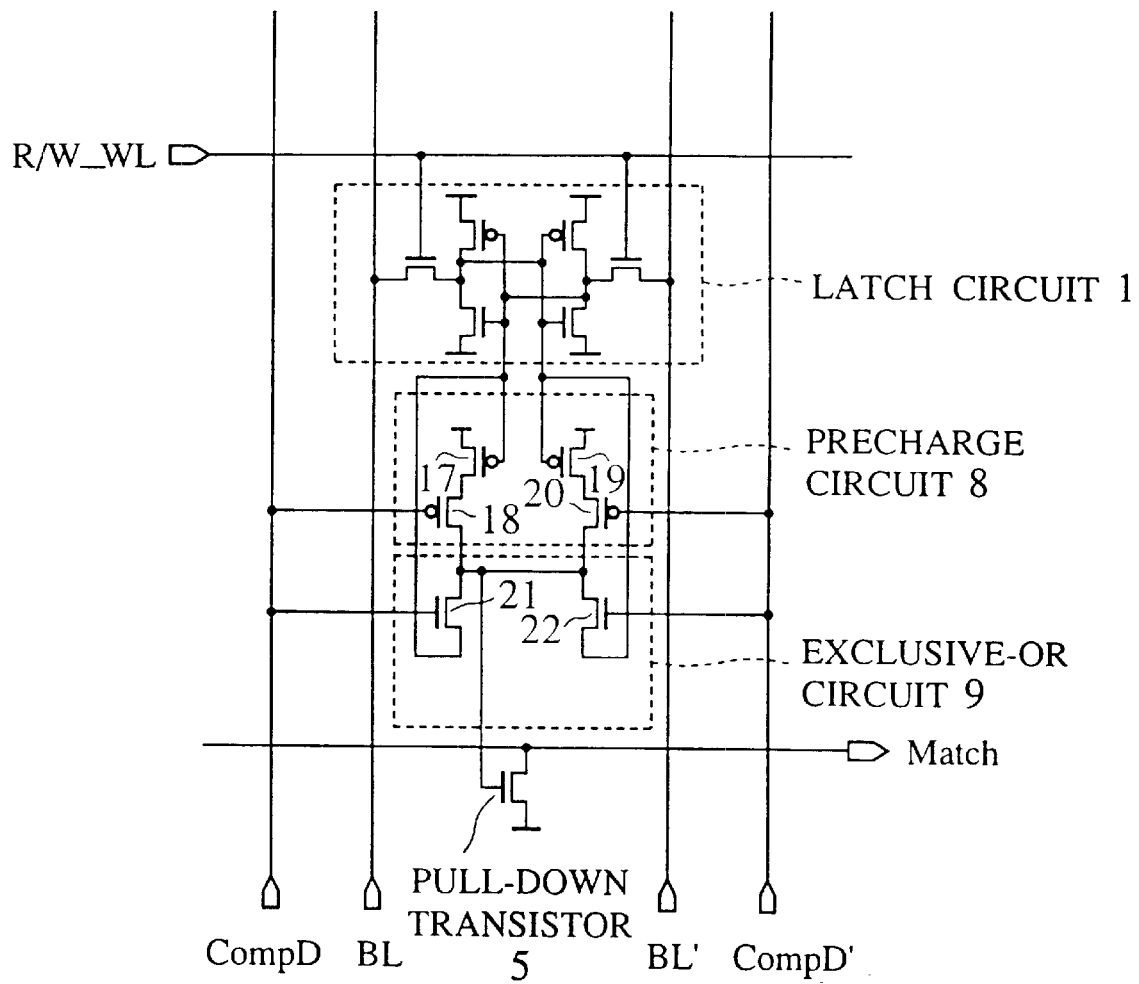
FIG. 5 is a circuit diagram of a fourth embodiment of a CAM Cell Circuit of the present invention.

FIG. 5 is a circuit diagram of a fourth embodiment of a CAM Cell Circuit of the present invention. The CAM Cell Circuit comprises a latch circuit 1, a pre-charging circuit 8, an exclusive-OR circuit 9, and a pull-down transistor 5. Those circuits are connected to a read/write word line R/W WL, a bit line BL, a bit line BL', comparison data lines CompD, CompD', and a match line.

It is different from the first embodiment shown in FIG. 2 that the pre-charging circuit 8 of this embodiment connects in parallel PMOS transistors 17, 18 in series-connection, and PMOS transistors 19, 20 in series connection, the pre-charging voltage to the exclusive-OR circuit 9 is preserved even after the pre-charging period, and the exclusive-OR circuit 9 of this embodiment comprises a circuit with MOS transistors 21, 22 in parallel connection.

Then the operation of this embodiment will be described: Firstly, the latch circuit 1 is assumed to preserve "0". Therefore, "0" is applied to the gate of the PMOS transistor 19, and the transistor 19 has become on. During a pre-charging period under "0", "0" states of the comparison data lines CompD, CompD', the PMOS transistor 20 of the pre-charging circuit 8, and a circuit having the PMOS transistors 19, 20 in series-connection become on. And "1" is applied to the MOS transistors 21, 22 of the exclusive-OR circuit 9 to pre-charge the circuit 9.

During an evaluation period, "0" is input to the comparison data line CompD, "1" to the line CompD'. Hereby, "0" is applied to the gate of the MOS transistor 21, and "1" to the gate of the MOS transistor 22.

The MOS transistor 21 becomes off, and the MOS transistor 22 on. Therefore, "0" is input to the source of the MOS transistor 22, and the drains of the MOS transistors 21, 22 become "0" to apply "0" to the gate of the pull-down transistor 5. Then, the pull-down transistor 5 becomes off, and the match line Match "1" to detect that the same data as comparison data is stored on the latch circuit 1.

During the evaluation period, "1" is applied to the PMOS transistors 17, 20, and "0" to the PMOS transistors 18, 19. Then, the PMOS transistor 17, and the PMOS transistor 20 become off. Hereby, "1" is not applied to the exclusive-OR circuit 9 from the pre-charging circuit 8, and the drains of the MOS transistor 21, 22 of the exclusive-OR circuit 9 preserve "0" not to cause the floating state of the exclusive-OR circuit 9.

Secondly, the latch circuit 1 is assumed to preserve, for example, "1". During the pre-charging period, "0" is input to the comparison data lines CompD, CompD', and the transistors 17, 18 become on to pre-charge the exclusive-OR circuit 9.

During the evaluation period, "0" is input to the comparison data line CompD, and "1" to the CompD'. Hereby, "0" is applied to the gate of the MOS transistor 21, and "1" to the gate of the MOS transistor 22 to cause the off state of the former 21, and the on state of the latter 22

At this time, "1" is applied to the source of the MOS transistor 22, as the latch circuit 1 preserves "1", and the drains of the MOS transistors 21, 22 become "1".

Accordingly, "1" is applied to the gate of the pull-down transistor 5. Then, the pull-down transistor 5 becomes on, and the match line Match "0" to detect that different data from comparison data is stored on the latch circuit 1 (a not-match state).

However, during the evaluation period, as the transistors 17, 18 become on, the drains of the MOS transistors 21, 22 remain "1" not to cause the floating state.

According to this embodiment, as the exclusive-OR circuit 9 comprises two transistors, it is possible to install smaller number of circuit elements than that of conventional circuits, reduce the circuit area, and speed up the operation. And, even during the evaluation period, the pre-charging circuit 8 becomes on not to cause the floating state, and it is possible to stabilize the operation.

Figure 6A:
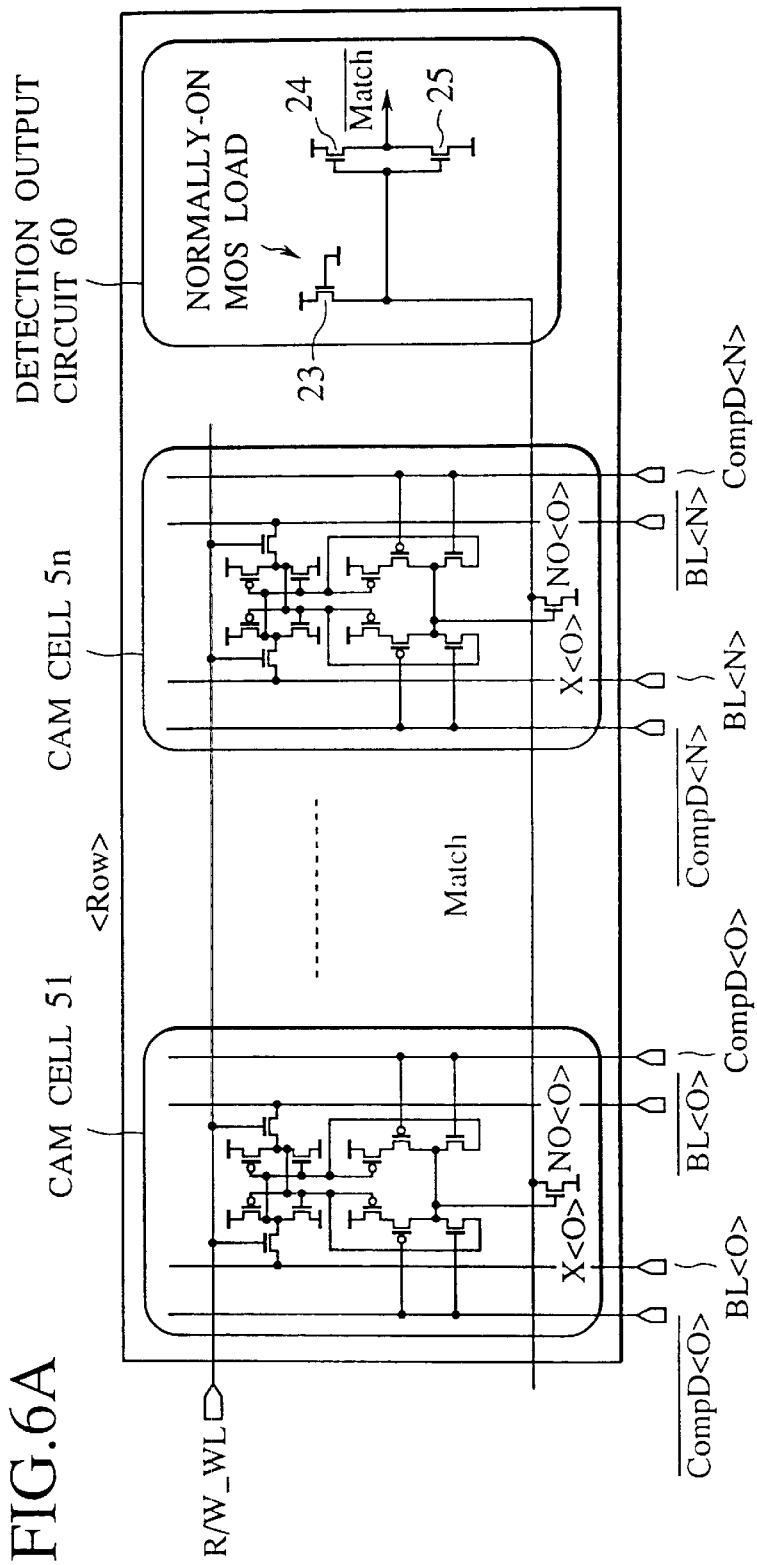
FIGS. 6A and 6B are circuit diagram of a configuration example using the fourth embodiment shown in FIG. 5 as a match detection circuit.

FIG. 6 is a circuit diagram of a configuration example using the fourth embodiment shown in FIG. 5 as a match detection circuit. As shown in FIG. 6(A), a plurality of CAM Cell Circuits 5l–5n are connected to a common read/write word line R/W WL, and a common match line Match.

The match line Match is in a pull-up state by a normally-on PMOS transistor 23 of a detection output circuit 60. A PMOS transistor 24, and MOS transistor 25 compose the inverter.

Figure 6B:
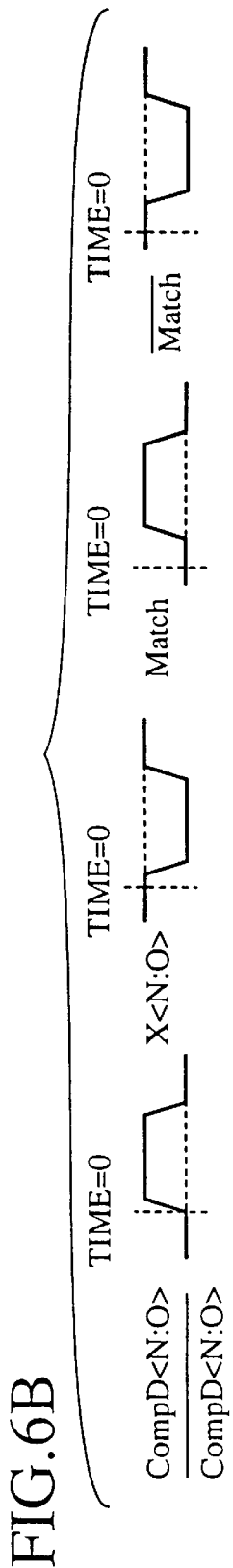

As shown in FIG. 6(B), when all the data stored on the CAM Cell Circuits 51–5n are the same as the comparison data, the match line Match becomes "1", and "0" is output from the inverter to detect that the same data as the comparison data is stored on the CAM Cell Circuits 5l–5n.

However, when one or more data of any data of the CAM Cell Circuits 5l–5n are different from the comparison data, the match line Match becomes "0", and "1" is output from the inverter to detect that the stored data on the CAM Cell Circuits 5l–5n are not the same as the comparison data.

Fifth Embodiment

Figure 7:
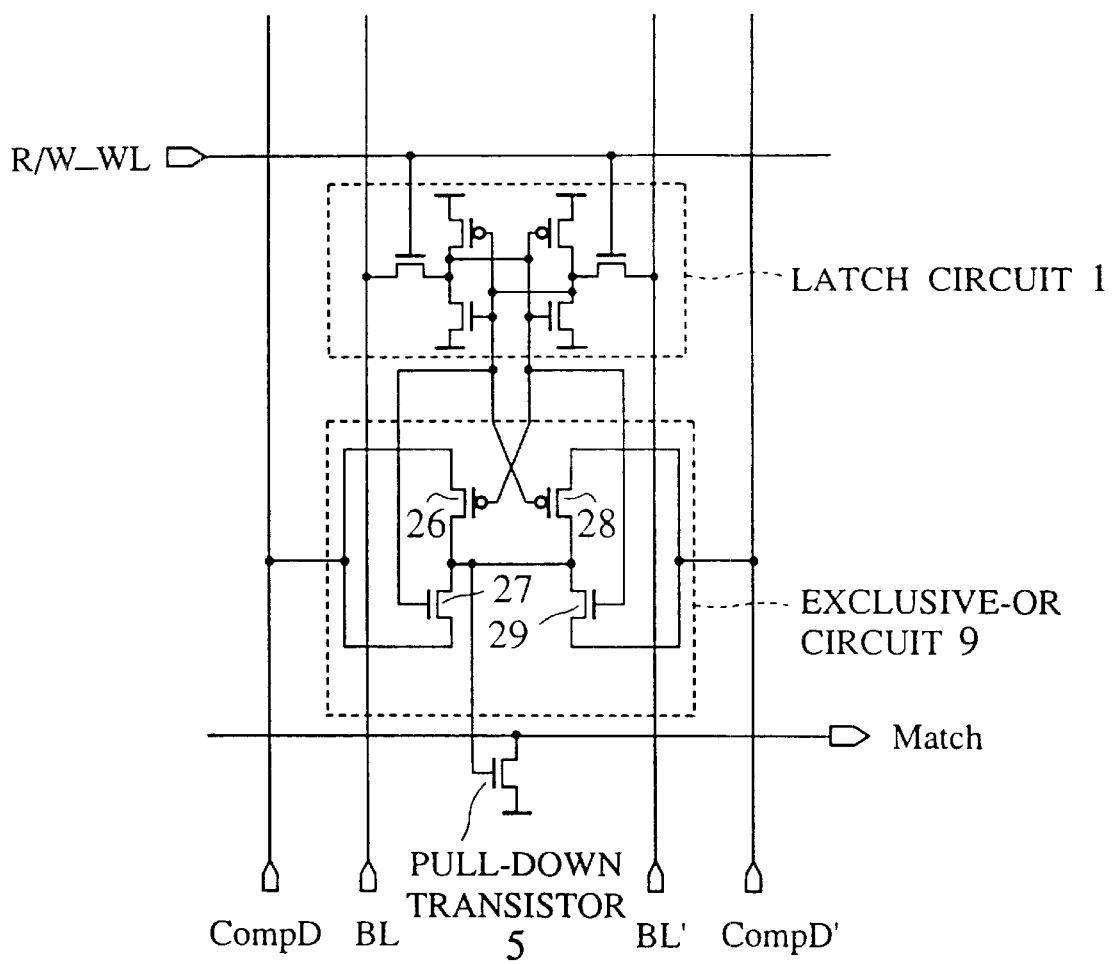
FIG. 7 is a circuit diagram of a fifth embodiment of a CAM Cell Circuit of the present invention.

FIG. 7 is a circuit diagram of a fifth embodiment of a CAM Cell Circuit of the present invention. The CAM Cell Circuit comprises a latch circuit 1, an exclusive-OR circuit 9, and a pull-down transistor 5. Those circuits are connected to a read/write word line R/W WL, a bit line BL, a bit line BL', comparison data lines CompD, CompD', and a match line. In this embodiment, the exclusive-OR circuit 9 is of a static type to eliminate a pre-charging circuit.

Then the operation of the embodiment will be described:

The latch circuit 1 is assumed to preserve "0". Hereby, "1" is applied to the gates of a MOS transistor 27, and a PMOS transistors 28, and "0" to the gates of a MOS transistor 29, and a PMOS transistors 26. "0" is input to the comparison data line CompD, and "1" to the line CompD'.

Then, the MOS transistor 29, and the PMOS transistor 28 become off, and the PMOS transistor 26, and the MOS transistor 27 on. "0" is input to the source of the MOS transistor 27, and "0" is applied to the gate of the pull-down transistor 5.

Accordingly, the pull-down transistor 5 becomes off, and the match line Match "1" to detect that the same data as comparison data is stored on the latch circuit 1. According to this embodiment, by eliminating a pre-charging circuit, it is possible remarkably to reduce the number of transistors (3–5), and to speed up the operation by cutting the circuit area small. Moreover, the stable operation maybe secured by the static type of the exclusive-OR circuit 9.

Sixth Embodiment

Figure 8:
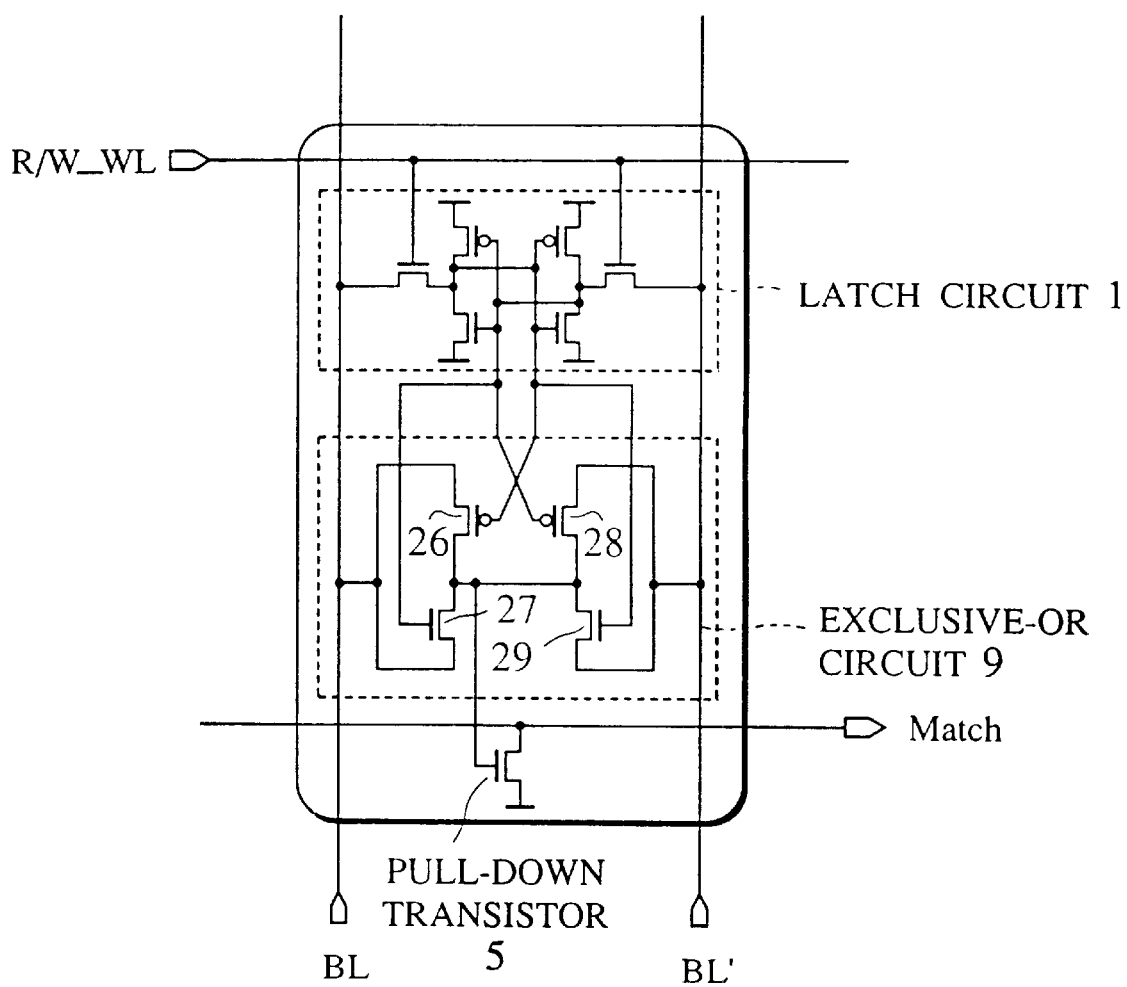
FIG. 8 is a circuit diagram of a sixth embodiment of a CAM Cell Circuit of the present invention.

FIG. 8 is a circuit diagram of a sixth embodiment of a CAM Cell Circuit of the present invention. Though the CAM Cell Circuit of this embodiment is the same as that of the fifth embodiment, comparison data lines CompD, CompD' are eliminated, a bit line BL, and a bit line BL' also serve as the comparison data lines CompD, CompD'.

Therefore, in this embodiment, data are firstly stored on the latch circuit 1, using the bit lines BL, BL', and then comparison data are input, using the bit lines BL, BL' to perform the same operation with the same effect as the fifth embodiment. Particularly, as the data lines CompD, CompD' may be eliminated in this embodiment, it is possible to reduce the wiring area with advantageous effects on high-density integration.

Figure 9A:
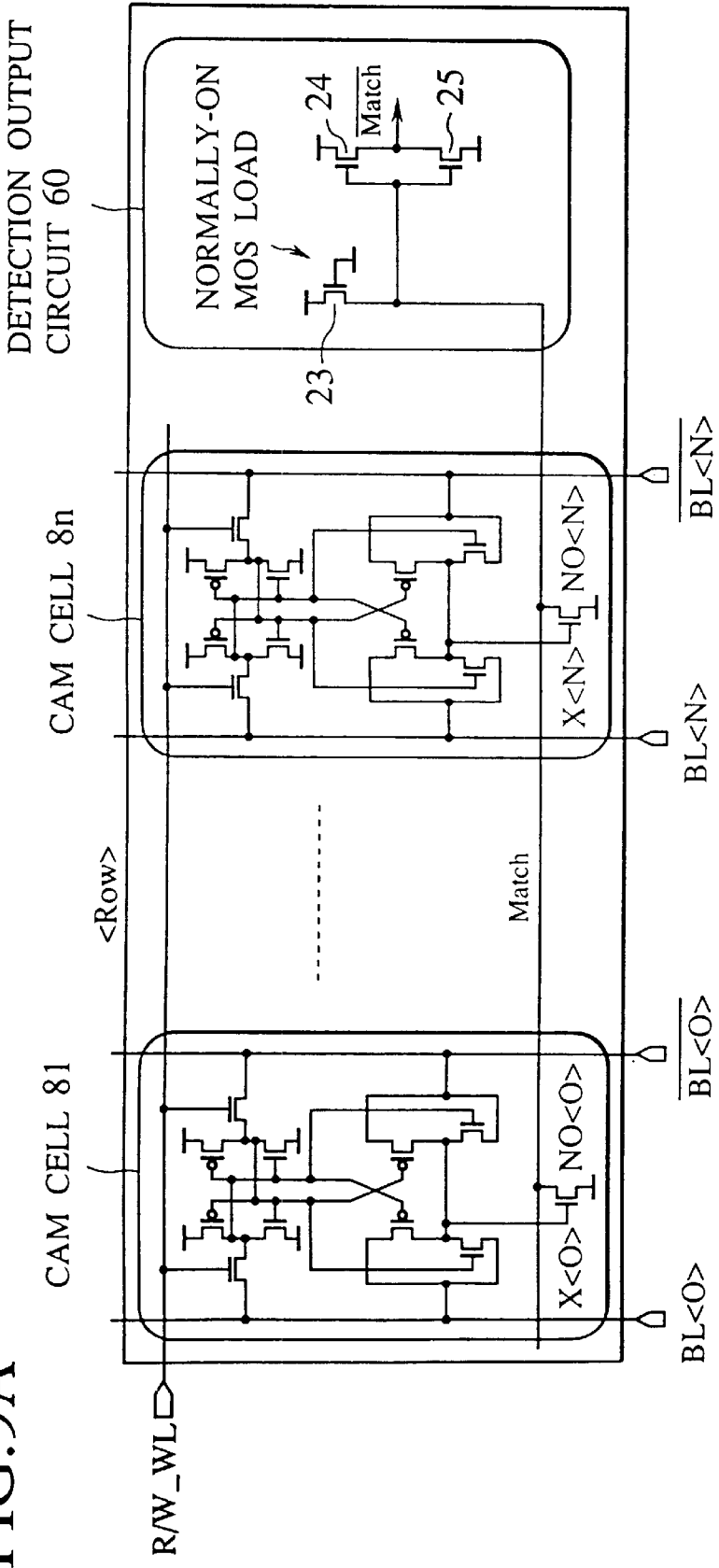
FIGS. 9A and 9B are circuit diagram of a configuration example using the fifth embodiment shown in FIG. 7 as a match detection circuit.

FIG. 9 is a circuit diagram of a configuration example using the fifth embodiment shown in FIG. 7 as a match detection circuit. As shown in FIG. 9(A), a plurality of CAM Cell Circuits 8l–5n are connected to a common read/write word line R/W WL, and a common match line.

The match line Match is in a pull-up state by a normally-on POMES transistor 23 of a detection output circuit 60. A PMOS transistor 24, and MOS transistor 25 compose the inverter.

Figure 9B:
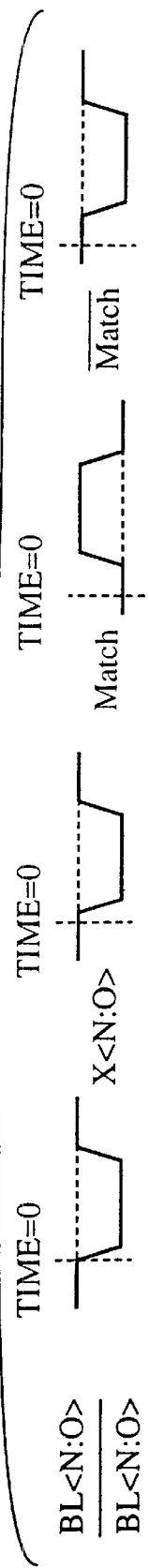

As shown in FIG. 9(B), when all the stored data on the CAM Cell Circuits 8l–8n are the same as the comparison data, the match line Match becomes "1", and "0" is output from the inverter to detect that the same data as the comparison data is stored on the CAM Cell Circuits 8l–8n.

However, when one or more data of any data of the CAM Cell Circuits 8l–8n are different from the comparison data, the match line Match becomes "0", and "1" is output from the inverter to detect that the stored data on the CAM Cell Circuits 8l–8n are not the same as the comparison data.

OTHER EMBODIMENTS

Various modifications will become possible for those skilled in the art after receiving the teachings of the present disclosure without depending from the scope thereof.

Naturally, the present invention may include various embodiments which have not been described herein. Hence the technical scope of the present invention is deemed defined only by the appended claims reasonably obtained from the interpretation thereof.

What is claimed is:

1. A CAM Cell circuit having a memory cell circuit to store data, a decision circuit to decide whether comparison data match stored data on said memory cell circuit or not, and an output circuit to output a decision result made by said decision circuit to a match line, said decision circuit comprising:

an exclusive-OR circuit connecting in parallel a circuit having first and second transistors in series-connection, and a circuit having third and fourth transistors in series-connection;

and a pre-charging circuit having a circuit connecting in series fifth and sixth transistors with different polarity from that of said first to fourth transistors, wherein stored data on said memory cell circuit, and stored data with different polarity from that of the former data are applied to each gate of said second and fourth transistors, respectively, said fifth and sixth transistors simultaneously become on to pre-charge said exclusive-OR circuit to output a not-match signal to said match line by controlling said output circuit before the decision operation, thereafter, comparison data and comparison data with different polarity from that of the former data are supplied to each gate of said first and third transistors, respectively, and said exclusive-OR circuit decides whether the stored data on said memory cell circuit match the comparison data to output a match or not-match signal to said match line by controlling said output circuit based on a decision result, and a pair of bit lines to input data to said memory cell circuit, which also serve as a pair of comparison data lines to input comparison data to said exclusive-OR circuit.

2. The Content Addressable Memory Cell Circuit of claim 1, wherein said memory cell circuit is a latch circuit, and said output circuit comprises a pull-down transistor to pull-down said match line to a reference potentional which means not-match state.

3. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

an exclusive-OR circuit connecting in parallel a circuit having first and second transistors in series-connection, and a circuit having third and fourth transistors in series-connection;

a pre-charging circuit connecting in parallel a circuit having fifth and sixth transistors with different polarity from that of said first to fourth transistors, and a circuit having seventh and eight transistors with different polarity from that of said first to fourth transistors, wherein stored data on said memory cell circuit, and stored data with different polarity from that of the former data are applied to each gate of said fifth and seventh transistors, respectively, stored data on said memory cell circuit and stored data with different polarity from that of the former data are applied to each gate of said second and fourth transistors, respectively, either said circuit having the fifth and sixth transistors in series-connection or said circuit having the seventh and eight transistors in series-connection becomes on to pre-charge said exclusive-OR circuit to output a not-match signal to said match line by controlling said output circuit before decision operation, thereafter, comparison data and comparison data with different polarity from that of the former data are applies to each gate of said first and third transistors, respectively, said exclusive-OR circuit decides whether the stored data on said memory cell circuit match the comparison data to output a match or not-match signal to said match line by controlling said output circuit based on a decision result, and a pair of bit lines to input data to said memory cell circuit, which also serve as a pair of comparison data lines to input comparison data to said exclusive-OR circuit.

4. The Content Addressable Memory Cell Circuit of claim 3, wherein said memory cell circuit is a latch circuit, and said output circuit comprises a pull-down transistor to pull-down said match line to a reference potential which means not-match state.

5. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

an exclusive-OR circuit having first and second transistors connected together at each drain;

a pre-charging circuit connecting in series fourth and fifth transistors with different polarity from that of said first and second transistors, wherein stored data on said memory cell circuit, and stored data with different polarity from that of the former data are applied to each source of said first and second transistors, respectively, said fourth and fifth transistors simultaneously become on to pre-charge said exclusive-OR circuit to output a not-match signal to said match line by controlling said output circuit before decision operation, thereafter, comparison data and comparison data with different polarity from that of the former data are applied to each gate of said first and second transistors, respectively, and said exclusive-OR circuit decides whether the comparison data match the stored data on said memory cell circuit to output a match or not-match signal to said match line by controlling said output circuit based on a decision result, and a pair of bit lines to input data to said memory cell circuit, which also serve as a pair of comparison data lines to input comparison data to said exclusive-OR circuit.

6. The Content Addressable Memory Cell Circuit of claim 5, wherein said memory cell circuit is a latch circuit, and said output circuit comprises a pull-down transistor to pull-down said match line to a reference potential which means not-match state.

7. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

an exclusive-OR circuit having first and second transistors connected together at each drain;

a pre-charging circuit connecting in parallel a circuit having third and fourth transistors with different polarity from that of said first and second transistors, and a circuit having fifth and sixth transistors with different polarity from that of said first and second transistors, wherein stored data on said memory cell circuit, and stored data with different polarity from that of the former data are applied to each gate of said third and fifth transistors, respectively, stored data on said memory cell circuit, and stored data with different polarity from that of the former data are applied to each source of said first and second transistors, either said circuit having said third and fourth transistors in series-connection, or said circuit having said fifth and sixth transistors in series-connection becomes on to pre-charge said exclusive-OR circuit to output a not-match signal to said match line by controlling said output circuit before decision operation, thereafter, the comparison data and the comparison data with different polarity from that of the former data are applied to each gate of said first and second transistors, respectively, and said exclusive-OR circuit decides whether the comparison data match the stored data on said memory cell circuit to output a match or not-match signal to said match line by controlling said output circuit based on a decision result, and a pair of bit lines to input data to said memory cell circuit, which also serve as a pair of comparison data lines to input comparison data to said exclusive-OR circuit.

8. The Content Addressable Memory Cell Circuit of claim 7, wherein said memory cell circuit is a latch circuit, and said output circuit comprises a pull-down transistor to pull-down said match line to a reference potential which means not-match state.

9. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

a static-type exclusive-OR circuit configured to connect in parallel a circuit having a first transistor and a second transistor with different polarity from that of the first one in series-connection, and a circuit having a third transistor and a fourth transistor with different polarity from that of the third one in series-connection, and to have said second and third transistors connected together at each drain, further to connect the drain of said first transistor, and the source of said second transistor, and to connect the drain of said third transistor, and the source of said fourth transistor, wherein stored data on said memory cell circuit, and stored data with different polarity from that of the former data are applied to each gate of said first and second transistors, respectively, become on to make said exclusive-OR circuit pre-charge state to output a not-match signal to said match line by controlling said output circuit before decision operation, thereafter, comparison data, and comparison data with different polarity from that of the former data are applied to each source of said second and third transistors, and said exclusive-OR circuit decides whether the comparison data match the stored data on said memory cell circuit or not to output a match or not-match signal to said match line by controlling said output circuit based on a decision result, and a pair of bit lines to input data to said memory cell circuit, which also serve as a pair of comparison data lines to input comparison data to said exclusive-OR circuit.

10. The Content Addressable Memory Cell Circuit of claim 9, wherein said memory cell circuit is a latch circuit, and said output circuit comprises a pull-down transistor to pull-down said match line to a reference potential which means not-match state.

11. The Content Addressable Memory Cell Circuit of claim 9, wherein said memory cell circuit is a latch circuit, and said output circuit comprises a pull-down transistor to pull-down said match line to a reference potential which means not-match state.

12. The Content Addressable Memory Cell Circuit of claim 10, wherein said memory cell circuit is a latch circuit, said output circuit comprises a pull-down transistor to pull-down said match line to a reference potential which means not-match state.

13. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

an exclusive-OR circuit having first and second transistors connected together at each drain;

and a pre-charging circuit connecting in parallel circuit having third and fourth transistors with different polarity from that of said first and second transistors, and a circuit having fifth and sixth transistors with different polarity from that of said first and second transistors, wherein stored data on said memory cell circuit, and stored data with different polarity from that of the former data are applied to each gate of said third and fifth transistors, respectively, stored data on said memory cell circuit, and stored data with different polarity from that of the former data are applied to each source of said first and second transistors, either said circuit having said third and fourth transistors in series-connection, or said circuit having said fifth and sixth transistors in series-connection becomes on to pre-charge said exclusive-OR circuit to output a not-match signal to said match line by controlling said output circuit before decision operation, thereafter, the comparison data and the comparison data with different polarity from that of the former data are applied to each gate of said first and second transistors, respectively, and said exclusive-OR circuit decides whether the comparison data match the stored data on said memory cell circuit to output a match or not-match signal to said match line by controlling said output circuit based on a decision result, and a pair of bit lines to input data to said memory cell circuit, which also serve as a pair of comparison data lines to input comparison data to said exclusive-OR circuit.

14. The Content Addressable Memory Cell Circuit of claim 13, wherein a pair of bit lines to input data to said memory cell circuit also serve as a pair of comparison data lines to input comparison data to said exclusive-OR circuit.

15. The Content Addressable Memory Cell Circuit of claim 13, wherein said memory cell circuit is a latch circuit, and said output circuit comprises a pull-down transistor to pull-down said match line to a reference potential which means not-match state.

16. The Content Addressable Memory Cell Circuit of claim 14, wherein said memory cell circuit is a latch circuit, and said output circuit comprises a pull-down transistor to pull-down said match line to a reference potential which means not-match state.

17. A CAM Cell Circuit having a memory cell circuit to store data, a decision circuit to decide whether comparison data match stored data on said memory cell circuit or not, and an output circuit to output a decision result made by said decision circuit to a match line, said decision circuit comprising:

a static-type exclusive-OR circuit configured to connect in parallel a circuit having a first transistor and a second transistor with different polarity from that of the first one in series-connection, and a circuit having a third transistor and a fourth transistor with different polarity from that of the third one in series-connection, and to have said second and third transistors connected together at each drain, further to connect the drain of said first transistor, and the source of said second transistor, and to connect the drain of said third transistor, and the source of said fourth transistor, wherein stored data on said memory cell circuit, and stored data with different polarity from that of the former data are applied to each gate of said first and second transistors, respectively, become on to make said exclusive-OR circuit pre-charge state to output a not-match signal to said match line by controlling said output circuit before decision operation, thereafter, comparison data, and comparison data with different polarity from that of the former data are applied to each source of said second and third transistors, and said exclusive-OR circuit decides whether the comparison data match the stored data on said memory cell circuit or not to output a match or not-match signal to said match line by controlling said output circuit based on a decision result, and a pair of bit lines to input data to said memory cell circuit, which also serves as a pair of comparison data lines to input comparison data to said exclusive-OR circuit.

18. The Content Addressable Memory Cell Circuit of claim 17, wherein a pair of bit lines to input data to said memory cell circuit also serve as a pair of comparison data lines to input comparison data to said exclusive-OR circuit.

19. The Content Addressable Memory Cell Circuit of claim 17, wherein said memory cell circuit is a latch circuit, and said output circuit comprises a pull-down transistor to pull-down said match line to a reference potential which means not-match state.

20. The Content Addressable Memory Cell Circuit of claim 18, wherein said memory cell circuit is a latch circuit, and said output circuit comprises a pull-down transistor to pull-down said match line to a reference potential which means not-match state.

* * * * *

UNITED STATES PATENT AND TRADEMARK OFFICE
CERTIFICATE OF CORRECTION

PATENT NO.   : 6,421,264 B1
DATED        : July 16, 2002
INVENTOR(S)  : Hayakawa et al.

It is certified that error appears in the above-identified patent and that said Letters Patent is hereby corrected as shown below:

<u>Column 10,</u>
Line 60, change "eight" to -- eighth --.
Line 66, change "applies" to -- applied --

Signed and Sealed this

Seventeenth Day of September, 2002

*Attest:*

*Attesting Officer*

JAMES E. ROGAN
*Director of the United States Patent and Trademark Office*